US008541252B2

(12) United States Patent
Tansu et al.

(10) Patent No.: US 8,541,252 B2
(45) Date of Patent: Sep. 24, 2013

(54) ABBREVIATED EPITAXIAL GROWTH MODE (AGM) METHOD FOR REDUCING COST AND IMPROVING QUALITY OF LEDS AND LASERS

(75) Inventors: Nelson Tansu, Bethlehem, PA (US); Helen M. Chan, Bethlehem, PA (US); Richard P. Vinci, Easton, PA (US); Yik-Khoon Ee, Mountain View, CA (US); Jeffrey Biser, Coopersburg, PA (US)

(73) Assignee: Lehigh University, Bethlehem, PA (US)

( * ) Notice: Subject to any disclaimer, the term of this patent is extended or adjusted under 35 U.S.C. 154(b) by 39 days.

(21) Appl. No.: 12/972,418

(22) Filed: Dec. 17, 2010

(65) Prior Publication Data

US 2011/0147703 A1 Jun. 23, 2011

Related U.S. Application Data

(60) Provisional application No. 61/287,353, filed on Dec. 17, 2009.

(51) Int. Cl.
*H01L 33/04* (2010.01)

(52) U.S. Cl.
USPC .............. 438/46; 438/29; 438/47; 438/478; 257/13; 257/14; 257/98; 257/E33.008; 257/E21.09

(58) Field of Classification Search
USPC ........ 257/13, 14, 98, 200, E33.008, E33.067, 257/E21.09; 438/29, 46, 47, 478
See application file for complete search history.

(56) References Cited

U.S. PATENT DOCUMENTS

| | | | |
|---|---|---|---|
| 6,864,160 B2 | 3/2005 | Linthicum et al. | |
| 6,897,483 B2 | 5/2005 | Zheleva et al. | |
| 7,118,929 B2 | 10/2006 | Frayssinet et al. | |
| 7,220,658 B2 | 5/2007 | Haskell et al. | |
| 7,560,296 B2 | 7/2009 | Frayssinet et al. | |
| 7,566,580 B2 | 7/2009 | Keller et al. | |
| 7,626,246 B2 | 12/2009 | Lochtefeld et al. | |
| 2009/0001416 A1* | 1/2009 | Chua et al. | 257/190 |
| 2009/0162963 A1* | 6/2009 | Tansu et al. | 438/47 |
| 2009/0315013 A1* | 12/2009 | Tansu et al. | 257/13 |

OTHER PUBLICATIONS

Japanese Publication, JP 2005311119 Toshiaki et al.*
Park et al, Patterning of sapphire substrates via a solid state conversion process, Materials Research Society, vol. 20 No. 2 Feb. 2005.*
Kim et al. "Extraction efficiency enhancement in GaN-based light emitters grown on a holographically nano-patterned sapphire substrate" 2005, Quantum Electronics and Laser Science Conference pp. 1268-1271.*
Ee et al., IEEE J. Selected Topics in Quantum Electronics, vol. 15, No. 4, pp. 1066-1072 (Aug. 5, 2009).
Ee et al., J. Crystal Growth, 312, pp. 1311-1315 (Oct. 22, 2009).

* cited by examiner

*Primary Examiner* — Victor A Mandala
*Assistant Examiner* — Whitney T Moore
(74) *Attorney, Agent, or Firm* — Saul Ewing LLP

(57) ABSTRACT

The use of an abbreviated GaN growth mode on nano-patterned AGOG sapphire substrates, which utilizes a process of using 15 nm low temperature GaN buffer and bypassing etch-back and recovery processes during epitaxy, enables the growth of high-quality GaN template on nano-patterned AGOG sapphire. The GaN template grown on nano-patterned AGOG sapphire by employing abbreviated growth mode has two orders of magnitude lower threading dislocation density than that of conventional GaN template grown on planar sapphire. The use of abbreviated growth mode also leads to significant reduction in cost of the epitaxy. The growths and characteristics of InGaN quantum wells (QWs) light emitting diodes (LEDs) on both templates were compared. The InGaN QWs LEDs grown on the nano-patterned AGOG sapphire demonstrated at least a 24% enhancement of output power enhancement over that of LEDs grown on conventional GaN templates.

14 Claims, 7 Drawing Sheets

(a)

(b)

(a)

(b)

(a)

(b)

(a)

(b)

(a)

(b)

ABBREVIATED EPITAXIAL GROWTH MODE (AGM) METHOD FOR REDUCING COST AND IMPROVING QUALITY OF LEDS AND LASERS

CROSS-REFERENCE TO RELATED APPLICATIONS

This application claims the benefit of priority under 35 U.S.C. §119(e) of U.S. Provisional Patent Application No. 61/287,353, filed Dec. 17, 2009, the entire disclosure of which is hereby incorporated herein by reference.

STATEMENT OF GOVERNMENT INTEREST

This invention was made with government support under U.S. Department of Energy (DE-FC26-08NT01581) and US National Science Foundation (ECCS #0701421, and DMR #0705299). The government has certain rights in the invention.

BACKGROUND OF THE INVENTION

A large fraction of the electricity use in the United States is associated with lighting. LED lighting sources have huge advantages over conventional sources in terms of cost of use and impact on energy production, but high fabrication cost and limited brightness have limited adoption of solid state lighting outside certain niche applications such as traffic lights.

Sapphire is most commonly used as the substrate for nitride light emitting diodes (LEDs) in solid state lighting due to its physical robustness and high-temperature stability. A low-dislocation density GaN semiconductor template on sapphire is important for high-efficiency and reliable nitride light-emitting diodes (LEDs) in solid state lighting applications. In conventional metalorganic vapor phase epitaxy (MOVPE) of GaN on a sapphire substrate, the low temperature GaN buffer layer is etched-back by employing H2 at high temperature to form micron-sized GaN islands. The use of intentional delay of the nucleation island coalescence (recovery) reduces threading dislocation density. The etch-back and recovery process employed in conventional MOVPE of GaN on sapphire substrate adds 30 to 45 minutes in the GaN growth time, which increases the cost of epitaxy process.

The threading dislocation density of conventional MOVPE grown GaN template is still relatively high in the range of $10^8$-$10^{10}$ cm$^{-2}$. Several techniques have been utilized to reduce the threading dislocation density in MOVPE grown GaN template, such as lateral epitaxial overgrowth (LEO), pendeo epitaxy, and cantilever epitaxy. These approaches have led to reduction in the dislocation density of GaN template down to $10^6$-$10^7$ cm$^{-2}$, however the high quality material is limited in the narrow 2-3 µm stripe regions.

SUMMARY OF THE INVENTION

In this invention, a GaN template of MOVPE is grown on a nano-patterned AGOG c-plane sapphire substrate by employing a novel process referred to as an abbreviated GaN growth mode (AGGM). Nucleation growth evolution studies of GaN using AGGM on nano-patterned AGOG sapphire were performed. The growths of InGaN-based LEDs on both AGGM-based GaN/patterned sapphire and conventional GaN/planar sapphire templates were carried out. The device characteristics of III-Nitride LEDs grown on both templates were compared and analyzed. Cross-sectional transmission electron microscopy (CS-TEM) measurements were performed on both samples. The comparison studies indicated that the use of the abbreviated GaN growth mode leads to at least a two-order reduction in dislocation densities and improved efficiency in LED devices.

The invention involves first fabricating or acquiring a sapphire substrate with an array of surface dots that are sub-micrometer in scale, and have a dot-to-dot pitch that is also sub-micrometer in scale. Second, the AGGM growth sequence on the patterned surface consists of deposition of a thin low-temperature GaN layer followed immediately by deposition of a thick high-temperature GaN layer.

I. NANO-PATTERNING OF AGOG SAPPHIRE SUBSTRATE

Figure 1:
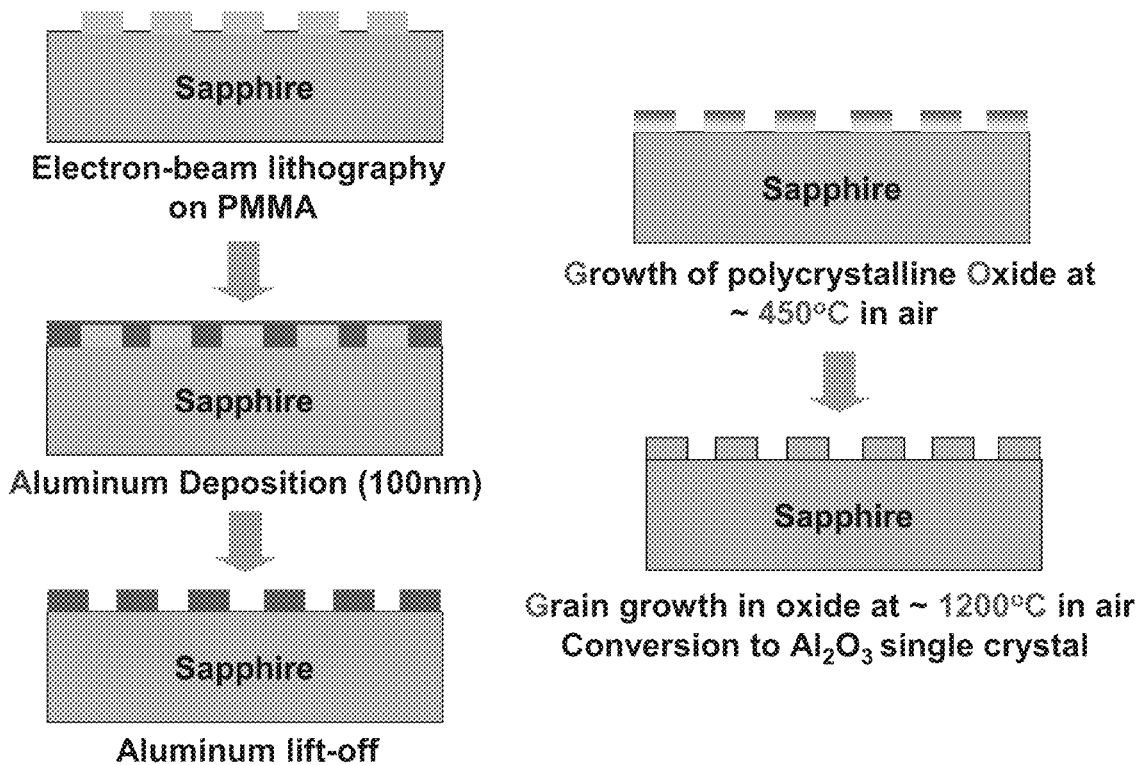
FIG. 1. is a schematic of the fabrication process of nano-patterned AGOG sapphire of an embodiment of the invention.
Figure 2:
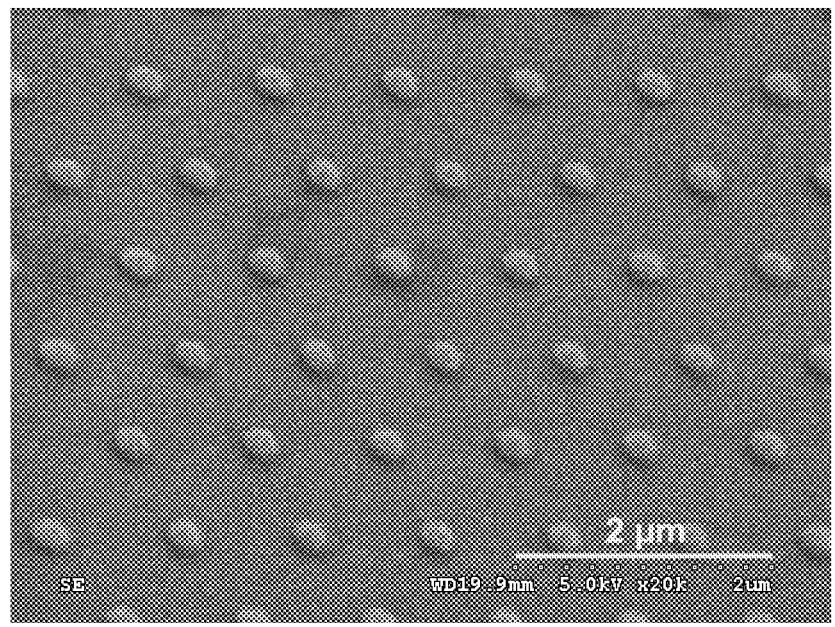
FIG. 2. are scanning electron micrographs of (a) aluminum nano-structure array after lift-off, and (b) aluminum nano-structure array conversion to single crystal $Al_2O_3$ after two-stage anneal.
Figure 2:
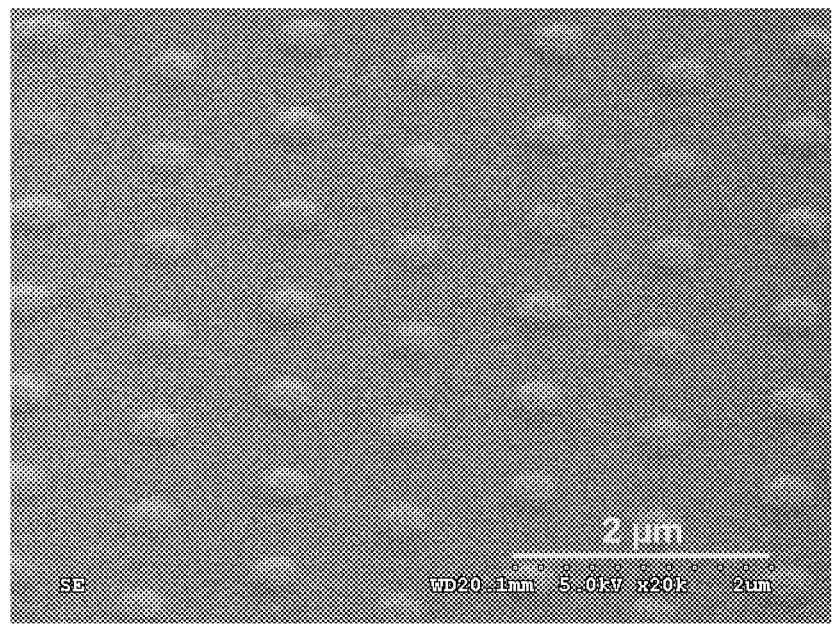

The nano-patterning of a sapphire substrate was fabricated by using a novel AGOG process which converts metallic aluminum (Al) into single crystal sapphire via a two stage annealing process. The acronym "AGOG" is coined from the process of converting Al into crystalline $Al_2O_3$ nanostructures: Deposition of Aluminum, Growth of Oxide, and Grain growth. The process schematics of an embodiment of the AGOG sapphire nano-patterning are shown in FIG. 1, as follows: (1) Electron-beam patterning of nanostructures on polymethyl methacrylate (PMMA), (2) deposition of 100 nm thick aluminum, (3) aluminum lift-off process leaving behind aluminum nanostructures comprising of an array of hexagons approximately 200 nm wide with center-to-center spacing of 400 nm (in a proof-of-concept experiment, the size of the patterned AGOG region was limited to 1 mm×1 mm; however, the size need not be limited to this experimental value), (4) first stage anneal at 450° C. in air to convert metallic aluminum into polycrystalline oxide, and (5) second stage anneal at 1200° C. in air to induce grain growth of the underlying sapphire single crystal to consume the oxide layer. The scanning electron microscopy (SEM) micrographs of the aluminum nanostructures before and after the two annealing stages in the AGOG conversion process are shown in FIGS. 2(a) and 2(b), respectively. As shown in FIGS. 2(a) and 2(b), good shape retention is achieved in the nanostructures after the two annealing processes. To verify that the converted Al nanostructures were crystalline sapphire, electron backscatter diffraction (EBSD) was conducted. Indexing of the patterns confirmed that the patterned AGOG nanostructures consisted of sapphire with the same orientation as the c-plane (0001) substrate.

II. ABBREVIATED GROWTH MODE ON PATTERNED AGOG SAPPHIRE

The growth of a conventional GaN template on c-plane planar sapphire substrate was performed as a control sample. The control sample consists of n-doped GaN template grown on planar c-plane sapphire by employing the conventional method. A 30 nm thick low temperature ($T_g$=535° C.) GaN was grown as a buffer layer, which is followed by the H2 etch-back and recovery process. The growth of a high temperature ($T_g$=1080° C.) n-GaN (thickness=0.28 nm) growth was carried out after the etch-back and recovery process.

The abbreviated GaN growth mode (AGGM) was carried out on nano-patterned AGOG sapphire substrate. In this embodiment of the claimed invention, a 15 nm thick low temperature GaN buffer is grown ($T_g$=535° C.), followed by the growth of high temperature GaN without the intermediate etch-back and recovery process. The thickness of the high-temperature ($T_g$=1080° C.) n-GaN layer is 2.8 µm. The details of the growth precursors used and the molar flow rate of precursors can be found in Y. K. Ee, J. M. Bider, W. Cao, H. M. Chan, R. P. Vinci, N. Tansu, *IEEE J. Sel. Top. Quantum Electron*, 15 (2009) 1066-1072.

To compare the LEDs device performance of different GaN templates, the LEDs active region and p-doped GaN were grown on the conventional GaN template, and the AGOG GaN template in the same epitaxy run. The InGaN-based LEDs active region comprises of four periods of $In_{0.15}Ga_{0.85}N$/GaN (2.5 nm/12 nm) quantum wells (QWs). After the growth of the active region ($T_g$=740° C.), the growth temperature was ramped up to 970° C. for the growth of p-doped GaN. The n-doping level and p-doping level of GaN was measured as $4.0×10^{18}$ cm$^{-3}$ and $5.0×10^{17}$ cm$^{-3}$, respectively.

III. NUCLEATION GROWTH EXPERIMENTS

Figure 3:
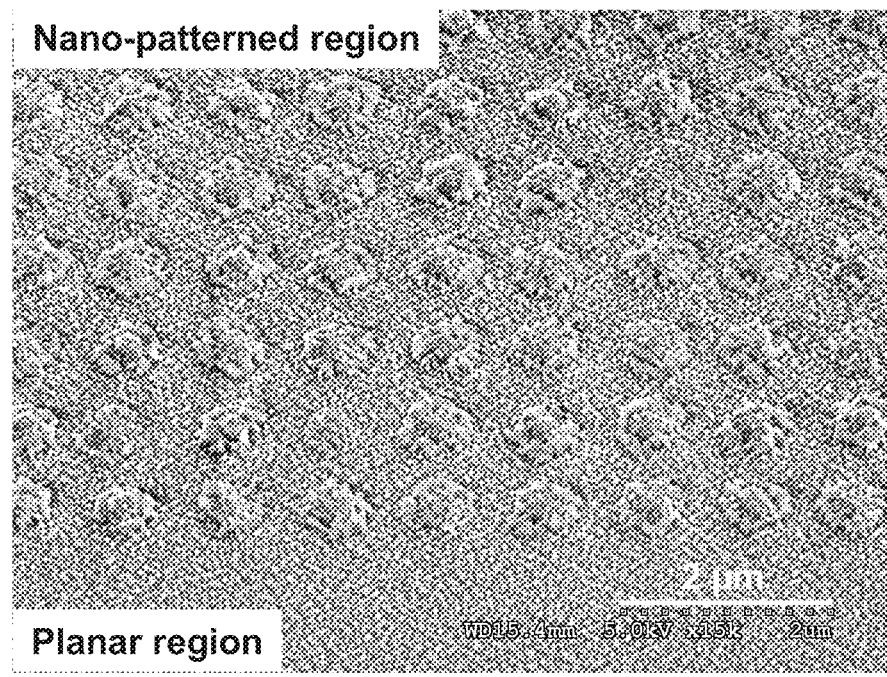
FIG. 3. are SEM images of (a) nano-patterned and planar sapphire regions with 15 nm GaN buffer layer, and (b) the nano-patterned sapphire region with 15 nm GaN buffer layer (higher magnification)
Figure 3:
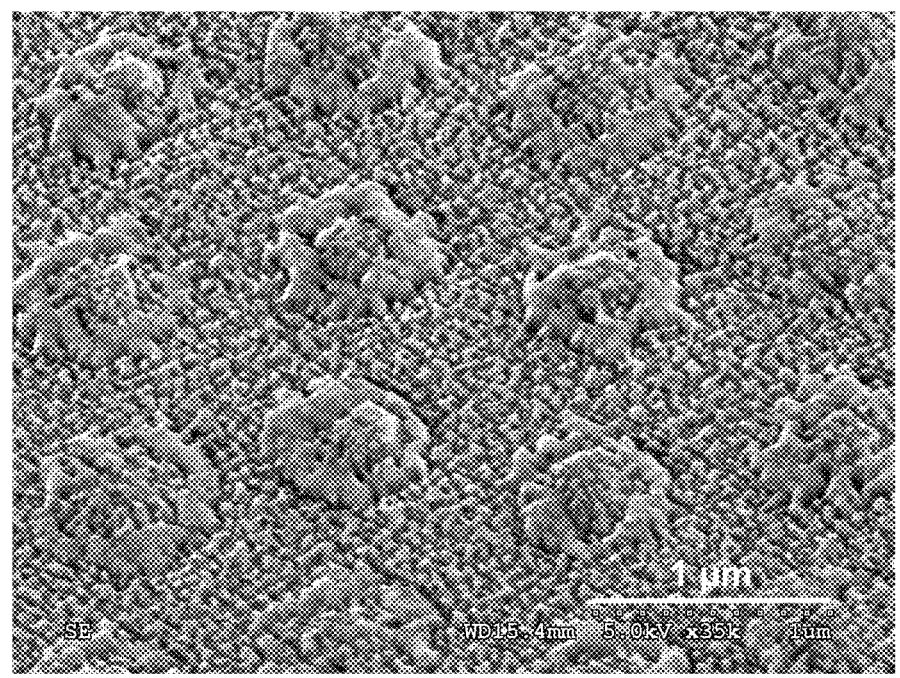

Growth evolution studies of the GaN nucleation on planar and nano-patterned AGOG sapphire substrates were conducted. FIG. 3(a) shows the SEM image of the nano-patterned AGOG region and planar sapphire region after the growth of 15 nm low temperature GaN buffer layer ($T_g$=535° C.). For the case of planar sapphire, the low temperature GaN nucleated uniformly across the entire region. However, the nucleation process on the nano-patterned AGOG sapphire region is very different from that observed on planar sapphire. Studies indicated that the low-temperature GaN preferentially nucleates on the patterned region with higher density. From FIG. 3(b), it was clear that the low temperature GaN preferentially nucleates around the base of the AGOG nano-patterns. The AGOG nano-patterns on sapphire altered the surface energy, which may have caused low temperature GaN buffer layer to replicate the nano-patterns by preferentially growing surrounding the existing AGOG nano-patterns.

Figure 4:
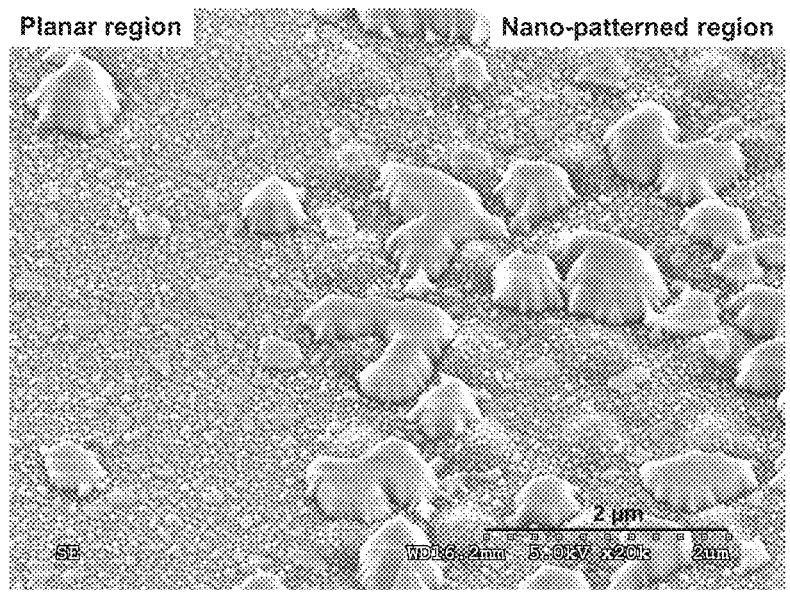
FIG. 4. are SEM images of (a) nano-patterned and planar sapphire regions with 15 nm GaN buffer layer and 3 min growth of high-temperature GaN, and (b) the nano-patterned sapphire with 15 nm GaN buffer layer and 3 min growth of high-temperature GaN (higher magnification)
Figure 4:
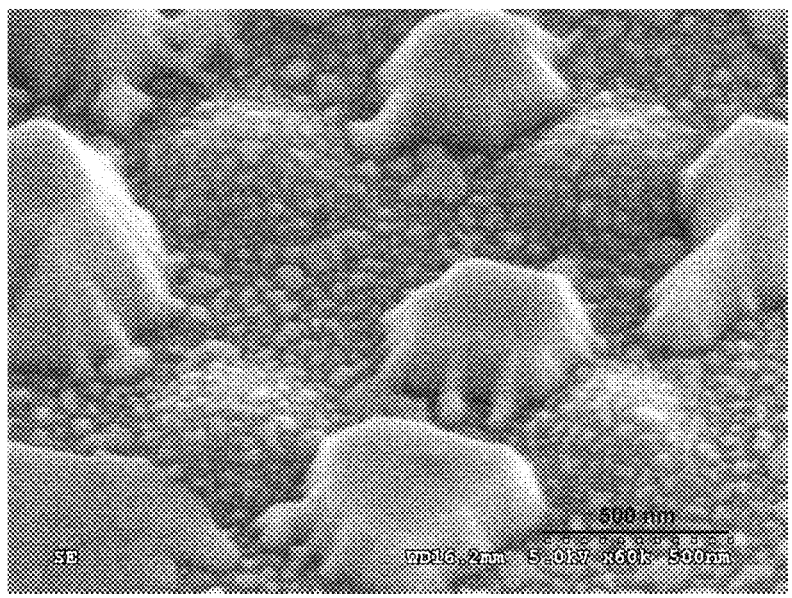

After 3 minutes of high temperature ($T_g$=1080° C.) GaN growth via abbreviated GaN growth mode, the GaN growth was interrupted. The SEM image of the GaN materials grown on the nano-patterned AGOG region and planar sapphire region is shown in FIG. 4(a). As shown in FIG. 4(a), high-temperature GaN islands preferentially grow on the patterned AGOG sapphire due to the higher density of the low-temperature GaN nucleated on the nano-patterned AGOG region. Thus, this result in higher density of high temperature GaN islands grown on the nano-patterned AGOG region. As shown in FIG. 4(b), studies indicated that the larger single crystal high temperature GaN islands preferentially grow in the valley region of the AGOG nanopatterns during the initial growth stage. The growth of high temperature GaN initiate from the low temperature GaN islands, indicating that the low temperature GaN in the AGOG nano-patterened region could have re-arranged its position from surrounding the AGOG nano-patterns to the regions between nano-patterns during the high temperature ramp up for the GaN growth. The re-arrangement of low temperature GaN during high temperature ramp up was also observed in high temperature TEM experiments.

Previous works have indicated that the threading dislocation bent when the micron-sized GaN island coalesced. Note that the nano-scale GaN islands formed in the initial growth of high-temperature GaN on patterned sapphire (FIG. 4(b)) preferentially nucleate on the nano-patterned AGOG region, thereby providing more GaN islands for coalescence. The increased interfaces for GaN island coalescence enhance the probability for the threading dislocations to bend, improving the GaN material quality.

Figure 5:
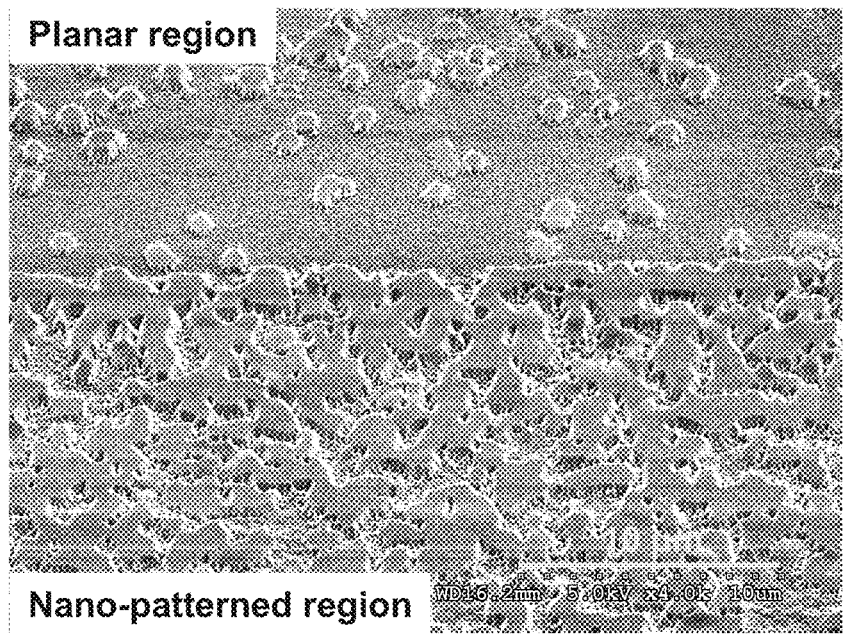
FIG. 5. are SEM images of (a) nano-patterned and planar sapphire regions with 15 nm GaN buffer layer and 0.1 µm thick high-temperature GaN, and (b) nano-patterned and planar sapphire regions with 15 nm GaN buffer layer and 0.25 µm thick high-temperature GaN.
Figure 5:
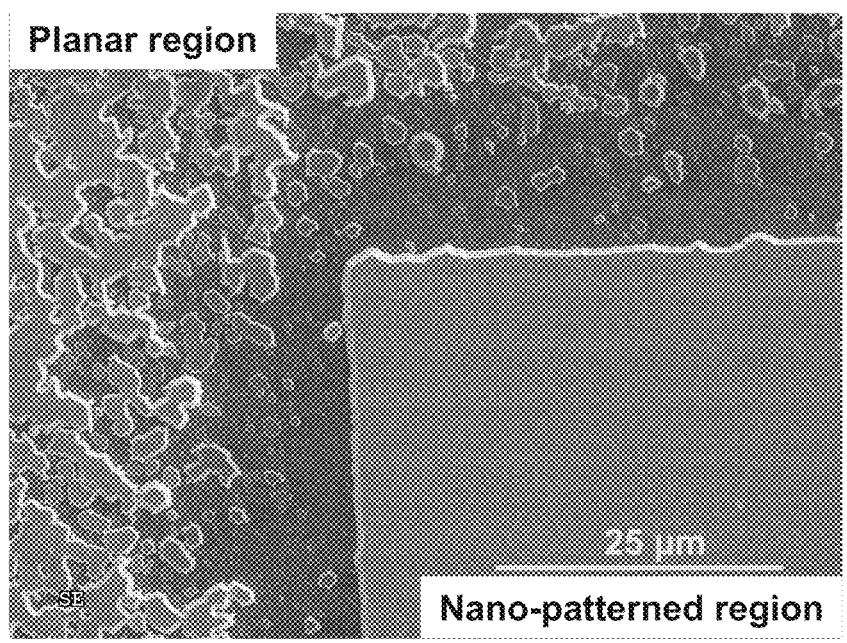

The growths of 0.1 µm thick (FIG. 5(a)) and 0.25 µm thick (FIG. 5(b)) high temperature GaN (by abbreviated growth mode) were conducted on nano-patterned AGOG and planar sapphire samples. The surface morphologies of the GaN material grown on these two regions were very different. In FIG. 5(a), the preferential growth of high temperature GaN on nano-patterned AGOG region was evident as the GaN has started to coalesce at much earlier stage, as compared to the coalescence for GaN grown on the planar sapphire. From FIG. 5(b), it can be observed that at 0.25 µm the high temperature GaN has completely coalesced forming a smooth film on the nano-patterned sapphire, but not on the planar region. The use of the abbreviated growth mode on nano-patterned sapphire provides significant advantage over the conventional approach, as this approach leads to significant cost reduction and epitaxy time.

IV. LEDS CHARACTERISTICS AND TEM RESULTS

Figure 6:
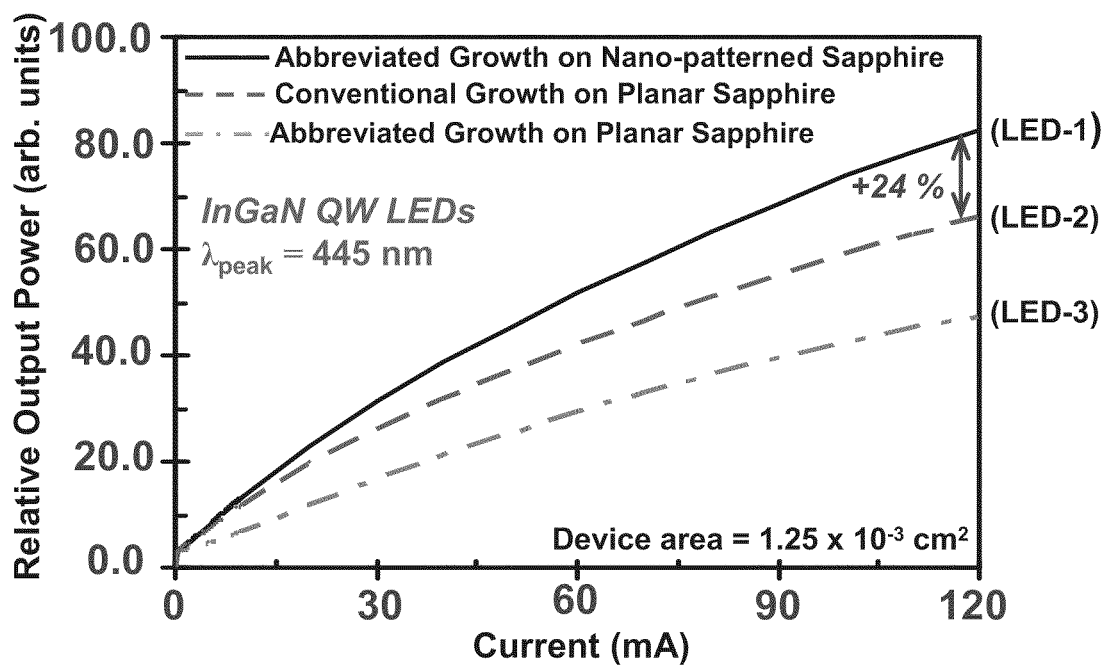
FIG. 6. is a graph showing room temperature CW light output power as a function of injection current of $In_{0.15}Ga_{0.85}N$ QW LEDs grown on three comparison templates (LEDs #1, #2, and #3)

FIG. 6 shows the light output power as a function of injection current for the 445 nm emitting InGaN QWs LEDs grown on different GaN templates as follows: GaN template grown by the abbreviated growth mode on nano-patterned AGOG sapphire (LED-1), GaN template grown by a conventional technique on planar sapphire (LED-2), and GaN template grown by the abbreviated growth mode on planar sapphire (LED-3). The LED devices with an area of $1.25×10^{-3}$ cm$^2$ were measured under continuous wave (CW) conditions at room temperature. The output power and efficiency of LED-1 (employing AGGM growth on patterned sapphire) exhibited enhancement by 24% in comparison to those of the conventional LED-2. For the LED-3 (without the etch-back and recovery process during the GaN template growth on planar sapphire), its output power was measured as 28% lower than that of the conventional LED-2.

Figure 7:
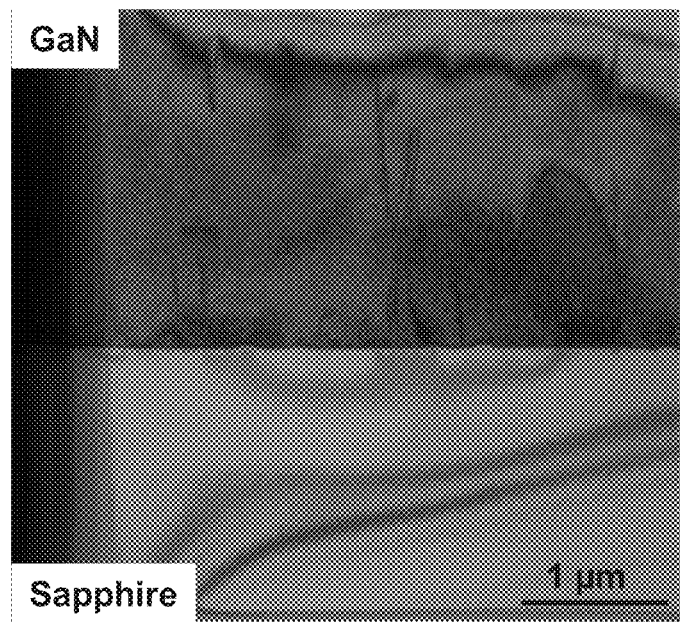
FIG. 7. shows cross-sectional TEM images taken at g=(0002) for (a) LED sample grown on nano-patterned sapphire with abbreviated growth mode, and (b) LED sample grown on planar sapphire using conventional growth.
Figure 7:
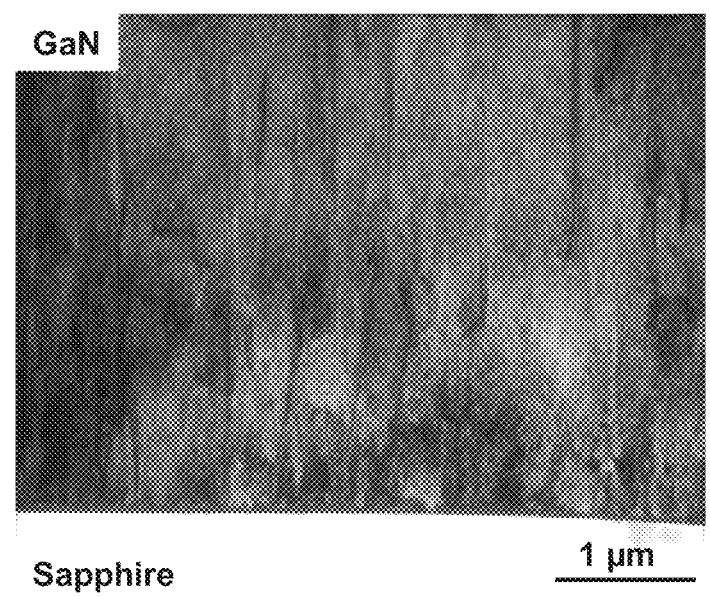

The cross-sectional TEM micrographs of the LED samples grown on nano-patterned AGOG substrate with the abbreviated growth mode (LED-1) and conventional GaN template (LED-2) are shown in FIGS. 7(a) and 7(b), respectively. Measurements indicate that the threading dislocation density of the GaN grown on nano-patterned AGOG sapphire and GaN grown on planar sapphire was $3\times10^7$ cm$^{-2}$ and $1\times10^9$ cm$^{-2}$, respectively. Using nano-patterned AGOG sapphire and abbreviated GaN growth mode, the threading dislocation density was approximately two orders of magnitude lower than conventional GaN template. The improvement observed in the output power of LED-1 can be attributed to the enhanced radiative efficiency of the InGaN QWs LEDs, due to a reduction in threading dislocation density in the GaN template grown on nano-patterned AGOG sapphire substrate.

The above-described experiments show that GaN abbreviated growth mode on nano-patterned AGOG sapphire substrate lead to reduction in the threading dislocation density in the GaN template. The use of GaN abbreviated growth mode also reduces epitaxy time and cost as this process bypasses the conventional etch-back and recovery process necessary in the growth of conventional GaN on planar sapphire substrates. Although electron beam patterning of the substrate is impractical as a production tool, other large-scale and low-cost lithography processes such as holography or sol-gel lithography approaches can be used to nano-pattern large batches of substrates. Once the large scale nano-patterning can be implemented, the thermal processing of the substrates can be performed as a batch process at relatively low cost. By employing the nano-patterned AGOG sapphire, large area (millimeter to wafer size) of high quality GaN template with lower threading dislocation density can be achieved. The use of high quality GaN template leads to improved internal quantum efficiency and reliability of LEDs.

In conclusion, nano-patterning of the sapphire substrate was conducted by using a novel AGOG process. By employing the nano-patterned AGOG sapphire, the use of GaN abbreviated growth mode could be conducted thereby reducing epitaxy cost and time. The abbreviated growth mode comprises of a thin 15 nm low temperature GaN buffer, followed by high temperature GaN growth without the etchback and recovery process. The GaN growth nucleation studies by employing the abbreviated growth mode were carried out. Our studies indicated that low-temperature GaN buffer layers were preferentially nucleating on the nano-patterned AGOG region, and the growth of high-temperature GaN also showed preferential coalescence at a much earlier stage compared to the high temperature GaN in the planar sapphire region.

Comparison studies were also conducted on 445 nm emitting InGaN QWs LEDs grown on both patterned and planar sapphire substrates. The LEDs grown on the GaN template on nano-patterned AGOG sapphire with GaN abbreviated growth mode demonstrated 24% improvement in the output power over the LEDs grown on conventional GaN template. The improvement observed in the LEDs devices grown on patterned sapphire substrates can be attributed to the two orders of magnitude reduction in the threading dislocation density observed from the TEM measurements. The use of abbreviated growth mode enables the epitaxy of low-dislocation density GaN on patterned AGOG sapphire substrate, without the need of etch-back and recovery process.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. A method of growing a GaN template on a substrate, comprising:
    performing an abbreviated GaN growth mode (AGGM) on a patterned sapphire substrate, said AGGM including:
        growing a thin low-temperature GaN layer on said substrate; and
        growing a thick high-temperature GaN layer on said thin layer.

2. The method of claim 1, wherein said growing of said thick high-temperature GaN layer is performed immediately following the growing of said thin low-temperature GaN layer.

3. The method of claim 2, wherein said thin low-temperature GaN layer has a thickness in the range of about 10-20 nm.

4. The method of claim 3, wherein said thick high-temperature GaN layer has a thickness in the range of about 0.10-0.30 µm.

5. The method of claim 3, wherein said thick high-temperature GaN layer has a thickness of about 0.25 µm.

6. The method of claim 5, wherein said low-temperature GaN layer is grown at a temperature in the range of about 525-545° C.

7. The method of claim 6, wherein said high-temperature GaN layer is grown at a temperature in the range of about 1070-1090° C.

8. The method of claim 6, wherein said high-temperature GaN layer is grown at a temperature of about 1080° C.

9. The method of claim 6, wherein said patterned sapphire comprises nano-patterned sapphire etched using an AGOG process.

10. The method of claim 5, wherein said low-temperature GaN layer is grown at a temperature of about 535° C.

11. The method of claim 2, wherein said thin low-temperature GaN layer has a thickness of about 15 nm.

12. The method of claim 1, wherein said patterned sapphire comprises nano-patterned sapphire.

13. An LED formed using the following steps:
    growing a GaN template on a substrate, comprising:
        performing an abbreviated GaN growth mode (AGGM) on a patterned sapphire substrate, said AGGM including:
            growing a thin low-temperature GaN layer on said substrate; and
            growing a thick high-temperature GaN layer on said thin layer; and
        growing an InGaN QWs LED on said GaN template.

14. The method of claim 13, wherein said patterned sapphire comprises nano-patterned sapphire.

* * * * *